US010453412B2

(12) United States Patent
Chen (10) Patent No.: US 10,453,412 B2
(45) Date of Patent: Oct. 22, 2019

(54) SHIFT REGISTER CIRCUIT, WAVEFORM GENERATING METHOD FOR SAME, AND DISPLAY PANEL USING THE SAME

(71) Applicants: HKC Corporation Limited, Shenzhen, Guangdong (CN); Chongqing HKC Optoelectronics Technology Co., Ltd., Chongqing (CN)

(72) Inventor: Yu-Jen Chen, Chongqing (CN)

(73) Assignees: HKC CORPORATION LIMITED, Shenzhen, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 107 days.

(21) Appl. No.: 15/546,123

(22) PCT Filed: May 31, 2017

(86) PCT No.: PCT/CN2017/086645
§ 371 (c)(1),
(2) Date: Jul. 25, 2017

(87) PCT Pub. No.: WO2018/205322
PCT Pub. Date: Nov. 15, 2018

(65) Prior Publication Data
US 2018/0336859 A1    Nov. 22, 2018

(30) Foreign Application Priority Data

May 12, 2017    (CN) .......................... 2017 1 0335538

(51) Int. Cl.
*G09G 3/36*        (2006.01)
*G11C 19/28*       (2006.01)

(52) U.S. Cl.
CPC ......... *G09G 3/3677* (2013.01); *G09G 3/3696* (2013.01); *G09G 2310/0286* (2013.01);
(Continued)

(58) Field of Classification Search
CPC ......... G09G 2310/0286; G09G 3/3677; G09G 3/3688; G09G 3/3674; G09G 2310/08;
(Continued)

(56) References Cited

U.S. PATENT DOCUMENTS 6,885,723 B2 *  4/2005  Yu ........................ G11C 19/28
                                                377/78
7,792,237 B2 *  9/2010  Chen ..................... G11C 19/28
                                                377/64
(Continued)

FOREIGN PATENT DOCUMENTS

CN          1341230 A      3/2002
CN        102779494 A     11/2012
(Continued)

OTHER PUBLICATIONS

International Search Report of PCT/CN2017/086645, dated Feb. 13, 2018.

*Primary Examiner* — Duc Q Dinh
(74) *Attorney, Agent, or Firm* — Locke Lord LLP; Tim Tingkang Xia, Esq.

(57) ABSTRACT

This application provides a shift register circuit, a waveform generating method for same, and a display panel using same. The shift register circuit includes a plurality of stages of shift registers, including: a first switch, including a control end of the first switch electrically coupled to a first node, a first end of the first switch electrically coupled to a frequency signal, and a second end of the first switch is electrically coupled to an output pulse signal; a second switch, including a control end of the second switch electrically coupled to an input
(Continued)

pulse signal, a first end of the second switch electrically coupled to the input pulse signal, and a second end of the second switch electrically coupled to the first node; a third switch, including a control end of the third switch electrically coupled to a second node, a first end of the third switch is electrically coupled to the output pulse signal, and a second end of the third switch is electrically coupled to a preset low potential; and a fourth switch, including a control end of the fourth switch is electrically coupled to the second node, a first end of the fourth switch is electrically coupled to the first node, and a second end of the fourth switch is electrically coupled to the preset low potential, a length of an internal channel between the first end of the fourth switch and the second end of the fourth switch is increased, or an internal channel between the first end of the fourth switch and the second end of the fourth switch is designed as dual channels.

12 Claims, 13 Drawing Sheets

(52) U.S. Cl.
CPC . *G09G 2320/0214* (2013.01); *G09G 2330/04* (2013.01); *G11C 19/28* (2013.01)

(58) Field of Classification Search
CPC ........... G09G 2330/021; G09G 3/3648; G09G 2310/066; G09G 2330/02; G09G 3/3266; G09G 2310/0289; G09G 2320/0223; G09G 2310/0267; G09G 2310/06; G09G 2320/045; G09G 2330/028; G09G 2300/043; G09G 2320/043; G11C 19/28; G11C 19/287; G11C 19/186; G11C 19/00; G11C 19/188; G11C 27/04; G11C 8/04
USPC .................................................. 345/98–100
See application file for complete search history.

(56) References Cited

U.S. PATENT DOCUMENTS

| | | | | |
|---|---|---|---|---|
| 9,378,692 | B2* | 6/2016 | Chen | G11C 19/28 |
| 9,477,345 | B2* | 10/2016 | Moon | G06F 3/0412 |
| 9,595,219 | B2* | 3/2017 | Shim | G09G 3/2092 |
| 2014/0079173 | A1* | 3/2014 | Yan | G11C 19/28 |
| | | | | 377/64 |
| 2017/0003804 | A1* | 1/2017 | Sung | G06F 3/0412 |

FOREIGN PATENT DOCUMENTS

| | | |
|---|---|---|
| CN | 103474037 A | 12/2013 |
| KR | 20160077315 A | 7/2016 |

\* cited by examiner

SHIFT REGISTER CIRCUIT, WAVEFORM GENERATING METHOD FOR SAME, AND DISPLAY PANEL USING THE SAME

BACKGROUND

Technical Field

This application relates to a circuit structure in a display, and in particular, to a shift register circuit, a waveform generating method for same, and a display panel using same.

Related Art

In recent years, with progress of science and technologies, flat liquid crystal displays gradually become popular and have advantages such as lightness and slimness. Currently, a driver circuit of a flat liquid crystal display is mainly constituted by connecting an external IC to a panel. However, this method cannot lower product costs or make the panel slimmer.

In addition, a liquid crystal display device usually includes a gate driver circuit, a source driver circuit, and a pixel array. The pixel array includes a plurality of pixel circuits. Each pixel circuit is switched on or off according to a scanning signal provided by the gate driver circuit. A data screen is displayed according to a data signal provided by the source driver circuit. With regard to the gate driver circuit, the gate driver circuit usually includes a plurality of stages of shift registers and outputs the scanning signal to the pixel array in a manner of transferring the scanning signal from a current-stage shift register to a next-stage shift register, so as to sequentially switch on the pixel circuits and enable the pixel circuit to receive the data signal.

Therefore, in a manufacturing process of a driver circuit, a gate driver circuit is directly manufactured on an array substrate to replace a driver chip made by connecting to an external IC. Such a technology, referred to as a gate driver on array (GOA), may be directly applied to a periphery of a panel, to reduce manufacturing procedures, product costs, and a thickness of the panel. However, pulling down a potential is alternately controlled by two groups of signals in the existing GOA technology, and a duty cycle is 50%. In this case, transistors responsible for pulling down the potential are in a positive voltage state for a long time and cannot get enough rest. As a result, reliability of the transistors rapidly degrades, and an electrical leakage risk is caused, further directly leading to low display quality or even damage to a display device. Therefore, to alleviate disadvantages of the foregoing conventional GOA circuit substrate technology, a gate array shift register having low manufacturing costs and an easy processing procedure is provided.

SUMMARY

To resolve the foregoing technical problems, this application is directed to providing a shift register circuit, a waveform generating method for same, and a display panel using same, so as to resolve an electrical leakage problem of a GOA circuit substrate, and improve reliability and a service life of a product.

The following technical solutions are used to achieve the objectives of this application and resolve technical problems thereof. A shift register circuit is provided according to this application, comprising a plurality of stages of shift registers, where each shift register comprises: a first switch, including a control end of the first switch electrically coupled to a first node, a first end of the first switch electrically coupled to a frequency signal, and a second end of the first switch electrically coupled to an output pulse signal; a second switch, including a control end of the second switch electrically coupled to an input pulse signal, a first end of the second switch electrically coupled to the input pulse signal, and a second end of the second switch electrically coupled to the first node; a third switch, including a control end of the third switch is electrically coupled to a second node, a first end of the third switch electrically coupled to the output pulse signal, and a second end of the third switch electrically coupled to a preset low potential; and a fourth switch, including a control end of the fourth switch electrically coupled to the second node, a first end of the fourth switch electrically coupled to the first node, and a second end of the fourth switch is electrically coupled to the preset low potential, a length of an internal channel between the first end of the fourth switch and the second end of the fourth switch is increased, or an internal channel between the first end of the fourth switch and the second end of the fourth switch is designed as dual channels.

Another objective of this application is to provide a waveform generating method for a shift register circuit, applied to a plurality of stages of shift registers, the shift register comprises a first switch, a second switch, a third switch, a fourth switch, a compensation circuit, a pull-down sub-circuit and a pull-down sub-circuit controller. The first switch is configured to generate an output signal of the shift register and provide the output signal to a next-stage shift register. The waveform generating method comprises: conducting the first switch, and pulling up a potential of an output end of the shift register by using a frequency signal; reducing a potential difference between a control end of the fourth switch and a first end of the fourth switch by adding the compensation circuit; and pulling down the potential of the output end of the shift register by means of an input pulse signal by using the second switch and the pull-down sub-circuit.

The technical problems of this application may be further resolved by taking the following technical measures.

In an embodiment of this application, a compensation circuit is further comprised, and the compensation circuit comprises: a fifth switch, including a control end of the fifth switch electrically coupled to the output pulse signal, a first end of the fifth switch electrically coupled to the output pulse signal, and a second end of the fifth switch electrically coupled to the preset low potential.

In an embodiment of this application, a pull-down sub-circuit is further comprised, and is electrically coupled to the first node, the output pulse signal, and the preset low potential of the shift register.

In an embodiment of this application, a pull-down sub-circuit controller is further comprised, and is electrically coupled to the preset low potential and the pull-down sub-circuit of the shift register.

In an embodiment of this application, the compensation circuit is configured to reduce a potential difference between the control end of the fourth switch and the first end of the fourth switch.

In an embodiment of this application, in the waveform generating method, the step of reducing a potential difference between a control end of the fourth switch and a first end of the fourth switch by adding the compensation circuit comprises: adding a fifth switch to the shift register, a control end of the fifth switch is electrically coupled to an output pulse signal, a first end of the fifth switch is electrically coupled to the output pulse signal, and a second end of the fifth switch is electrically coupled to a preset low potential.

In an embodiment of this application, in the waveform generating method, a pull-down sub-circuit is further comprised, and is electrically coupled to the first node, the output pulse signal and the preset low potential of the shift register.

In an embodiment of this application, in the waveform generating method, a pull-down sub-circuit controller is further comprised, and is electrically coupled to the preset low potential and the pull-down sub-circuit of the shift register.

In an embodiment of this application, in the waveform generating method, the compensation circuit is configured to reduce a potential difference between the control end of the fourth switch and the first end of the fourth switch.

Still another objective of this application is to provide a display panel, comprising: a first substrate; a plurality of pixels formed on the first substrate; and further comprising the shift register circuit, disposed on the first substrate.

This application resolves an electrical leakage problem of a GOA circuit substrate, and improves reliability and a service life of a product.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface", merely refer to directions of the accompanying drawings. Therefore, the used terms about directions are used to describe and understand this application, and are not intended to limit this application.

The accompanying drawings and the description are considered to be essentially illustrative, rather than limitative. In figures, units with similar structures are represented by using a same reference number. In addition, for understanding and ease of description, a size and a thickness of each component shown in the accompanying drawings are arbitrarily shown, but this application is not limited thereto.

In the accompanying drawings, for clarity, thicknesses of a layer, a film, a panel, an area, and the like are enlarged. In the accompanying drawings, for understanding and ease of description, thicknesses of some layers and areas are enlarged. It should be understood that when a component such as a layer, a film, an area, or a substrate is described to be "on" "another component", the component may be directly on the another component, or there may be an intermediate component.

In addition, throughout this specification, unless otherwise explicitly described to have an opposite meaning, the word "include" is understood as including the component, but not excluding any other component. In addition, throughout the specification, "on" means that one is located above or below a target component and does not necessarily mean that one is located on the top based on a gravity direction.

To further describe the technical measures taken in this application to achieve the objective of the present invention and effects thereof, specific implementations, structures, features, and effects of a shift register circuit, a waveform generating method for same, and a display panel using same is applied that are provided according to this application are described below in detail with reference to the accompanying drawings and preferred embodiments.

A display panel of this application may be, for example, a liquid crystal display panel, and may include an active array (thin film transistor (TFT)) substrate, a color filter (CF) substrate, and a liquid crystal layer formed between the two substrates. In an embodiment, the active array (TFT) and the color filter (CF) of this application may be formed on a same substrate.

In an embodiment, the liquid crystal panel of this application may be a curved-surface display panel.

Figure 1A:
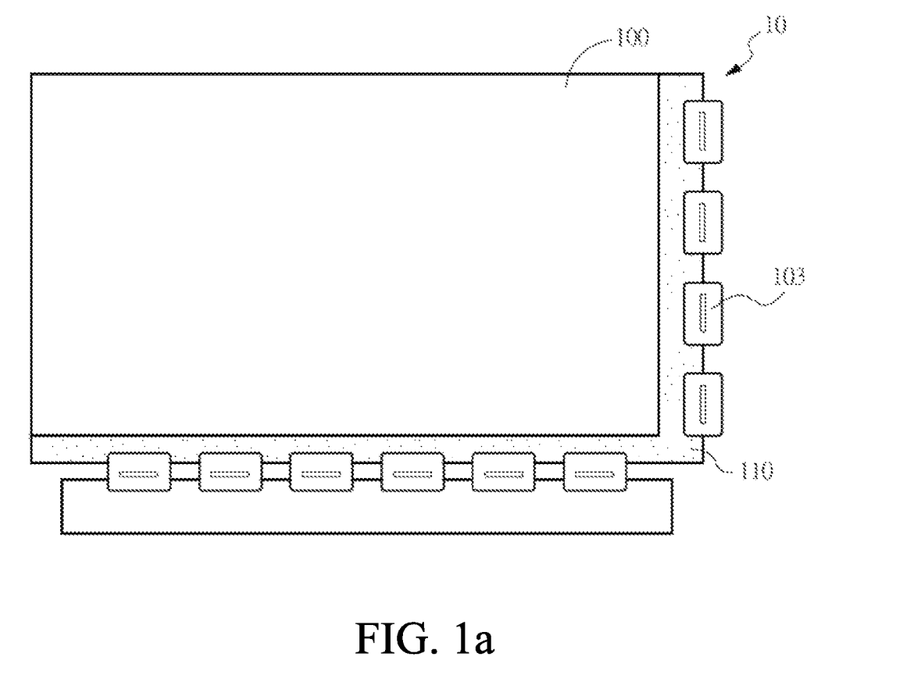
FIG. 1a is a schematic diagram of an exemplary liquid crystal display.

FIG. 1a is a schematic diagram of an exemplary liquid crystal display. Referring to FIG. 1a, a liquid crystal display 10 includes a color filter substrate 100, an active array substrate 110, and a driver chip 103, configured to drive a circuit.

Figure 1B:
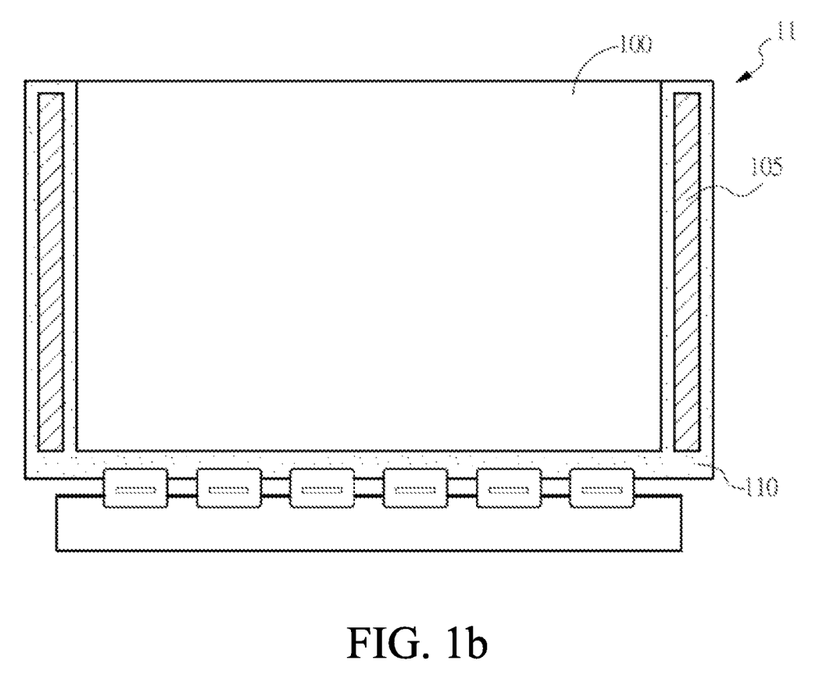
FIG. 1b is a schematic diagram of a liquid crystal display according to an embodiment of this application.

FIG. 1b is a schematic diagram of a liquid crystal display according to an embodiment of this application. Referring to FIG. 1b, in an embodiment of this application, a liquid crystal display 11 having a GOA includes: a color filter substrate 100, an active array substrate 110, and a GOA 105, configured to manufacture a gate driver circuit on the array substrate 110.

Figure 1C:
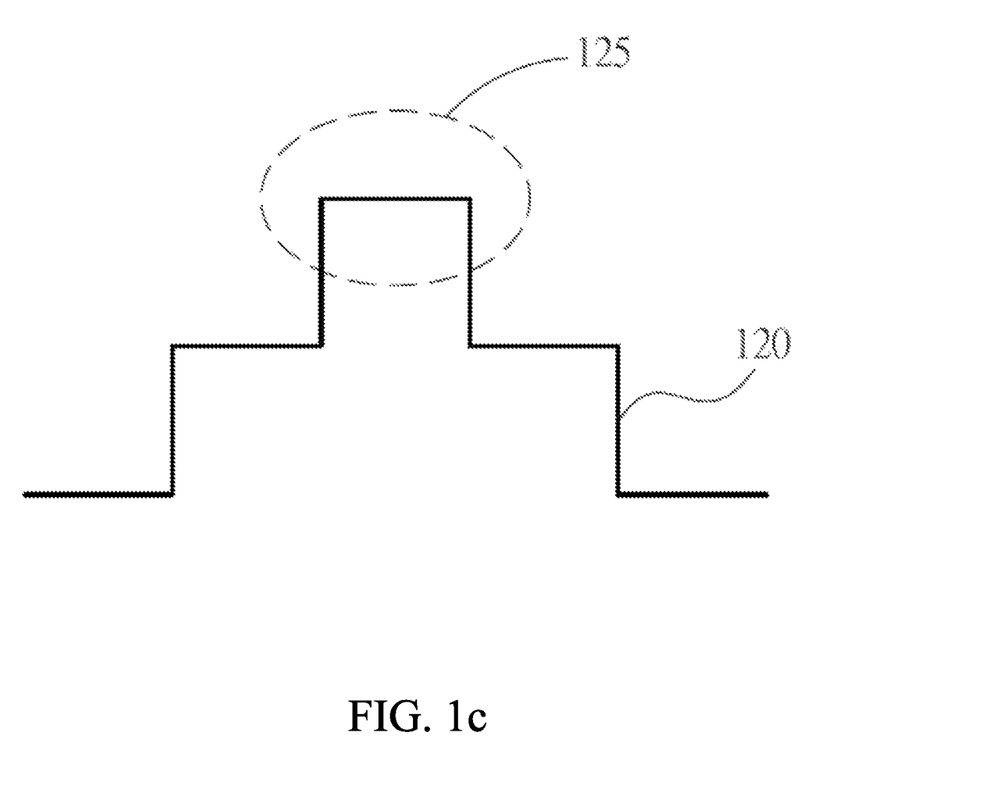
FIG. 1c is a schematic diagram of a waveform at a lifting point in an exemplary gate driver circuit substrate.

FIG. 1c is a schematic diagram of a waveform at a lifting point in an exemplary gate driver circuit substrate. Referring to FIG. 1c, a waveform 120 at a lifting point in a gate driver circuit substrate includes a high voltage level 125.

Figure 2A:
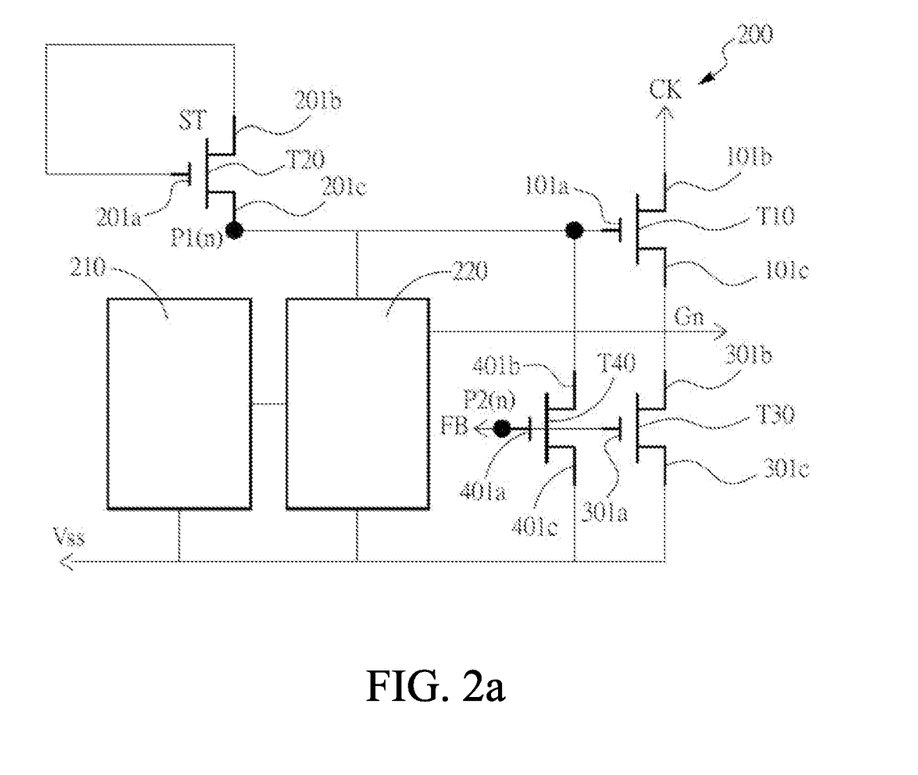
FIG. 2a is a schematic diagram of an exemplary shift register circuit.

FIG. 2a is a schematic diagram of an exemplary shift register circuit. Referring to FIG. 2a, a shift register circuit includes a plurality of stages of shift registers, where each shift register 200 includes: a first switch T10, including a control end 101a of the first switch T10 electrically coupled to a first node P1(n), a first end 101b of the first switch T10 electrically coupled to a frequency signal CK, and a second end 101c of the first switch T10 electrically coupled to an output pulse signal Gn; a second switch T20, including a control end 201a of the second switch T20 electrically coupled to an input pulse signal ST, a first end 201b of the second switch T20 electrically coupled to the input pulse signal ST, and a second end 201c of the second switch T20 electrically coupled to the first node P1(n); a third switch T30, including a control end 301a of the third switch T30 electrically coupled to a second node P2(n), a first end 301b of the third switch T30 electrically coupled to the output pulse signal Gn, and a second end 301c of the third switch T30 electrically coupled to a preset low potential Vss; and a fourth switch T40, including a control end 401a of the fourth switch T40 electrically coupled to the second node P2(n), a first end 401b of the fourth switch T40 electrically coupled to the first node P1(n), and a second end 401c of the fourth switch T40 electrically coupled to the preset low potential Vss.

In an embodiment, a pull-down sub-circuit 220 is further included, and is electrically coupled to the first node P1(n), the output pulse signal Gn, and the preset low potential Vss of the shift register.

In an embodiment, a pull-down sub-circuit controller 210 is further included, and is electrically coupled to the preset low potential Vss and the pull-down sub-circuit 220 of the shift register 200.

Figure 2B:
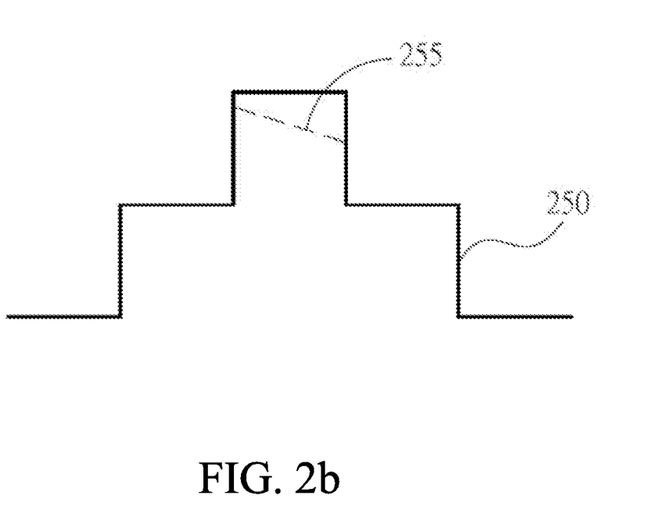
FIG. 2b is a schematic diagram of a waveform generated due to an electrical leakage in an exemplary shift register circuit.
Figure 2C:
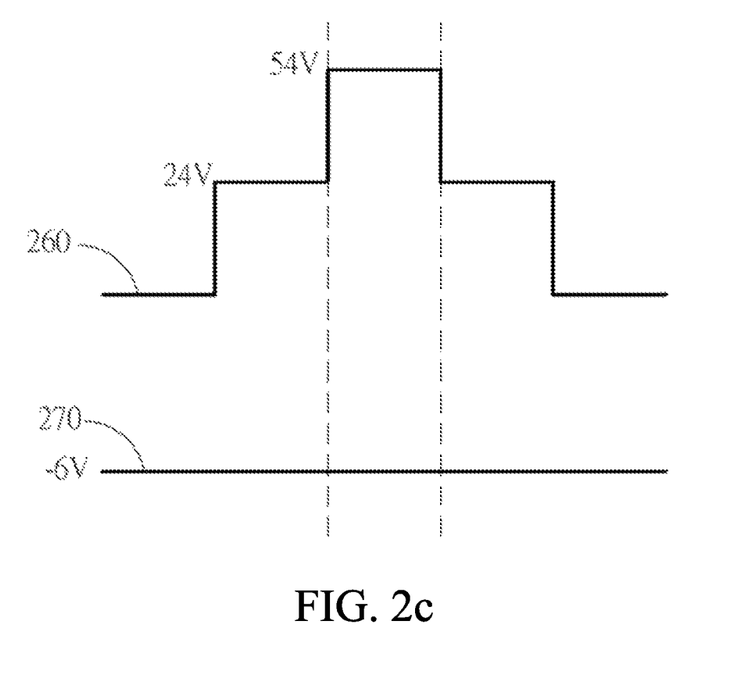
FIG. 2c is a schematic diagram of a potential difference generated due to an electrical leakage in an exemplary shift register circuit.
Figure 2D:
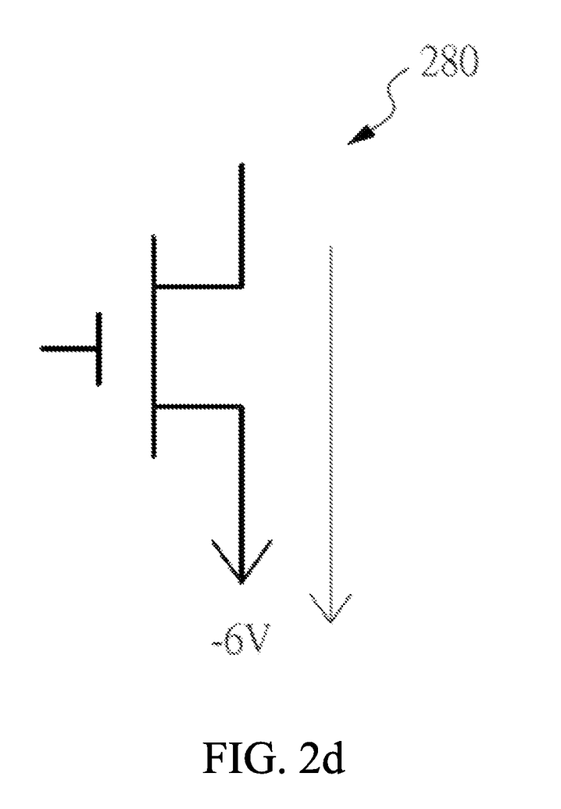
FIG. 2d is a schematic diagram of a transistor in an exemplary shift register circuit.

FIG. 2b is a schematic diagram of a waveform generated due to an electrical leakage in an exemplary shift register circuit; FIG. 2c is a schematic diagram of a potential difference generated due to a electrical leakage in an exemplary shift register circuit; and FIG. 2d is a schematic diagram of a transistor in an exemplary shift register circuit. Referring to FIG. 2b, a waveform 250 generated due to an electrical leakage at a lifting point in a gate driver circuit substrate includes a chamfering waveform 255.

Referring to FIG. 2a and FIG. 2c, in an embodiment, a potential waveform 270 of the control end 401a and a potential waveform 260 of the first end 401b in the fourth switch T40 are provided.

Referring to FIG. 2a and FIG. 2d, in an embodiment, a current flow direction of a transistor 280 in the fourth switch T40 is shown in FIG. 2d.

Figure 3A:
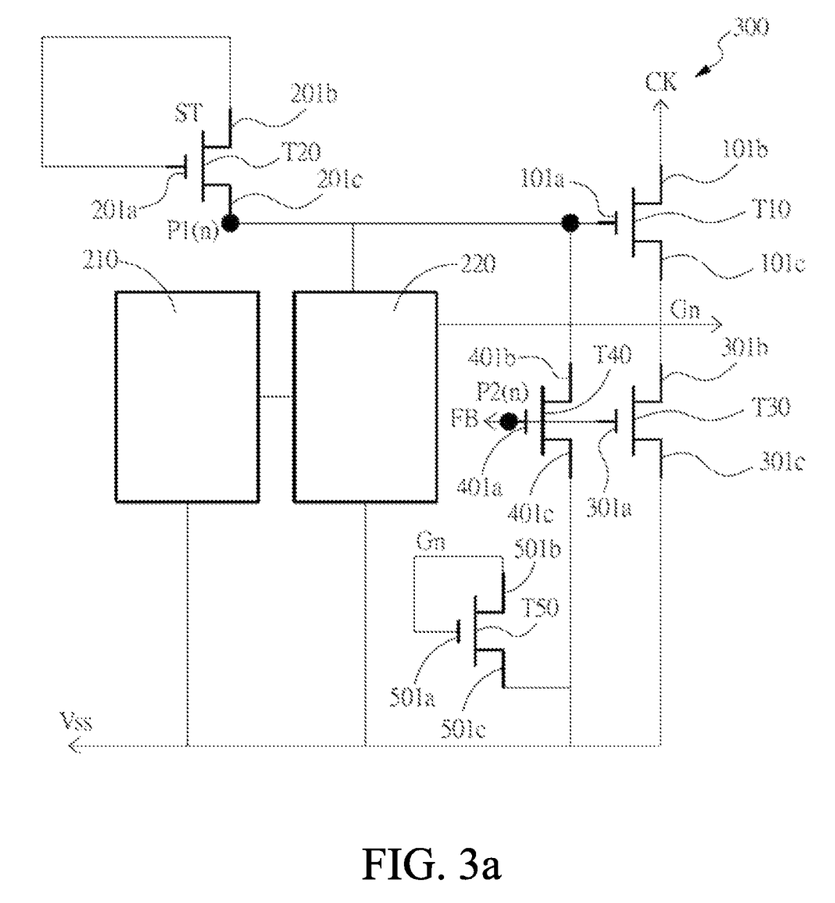
FIG. 3a is a schematic diagram of a shift register circuit according to an embodiment of this application.
Figure 3B:
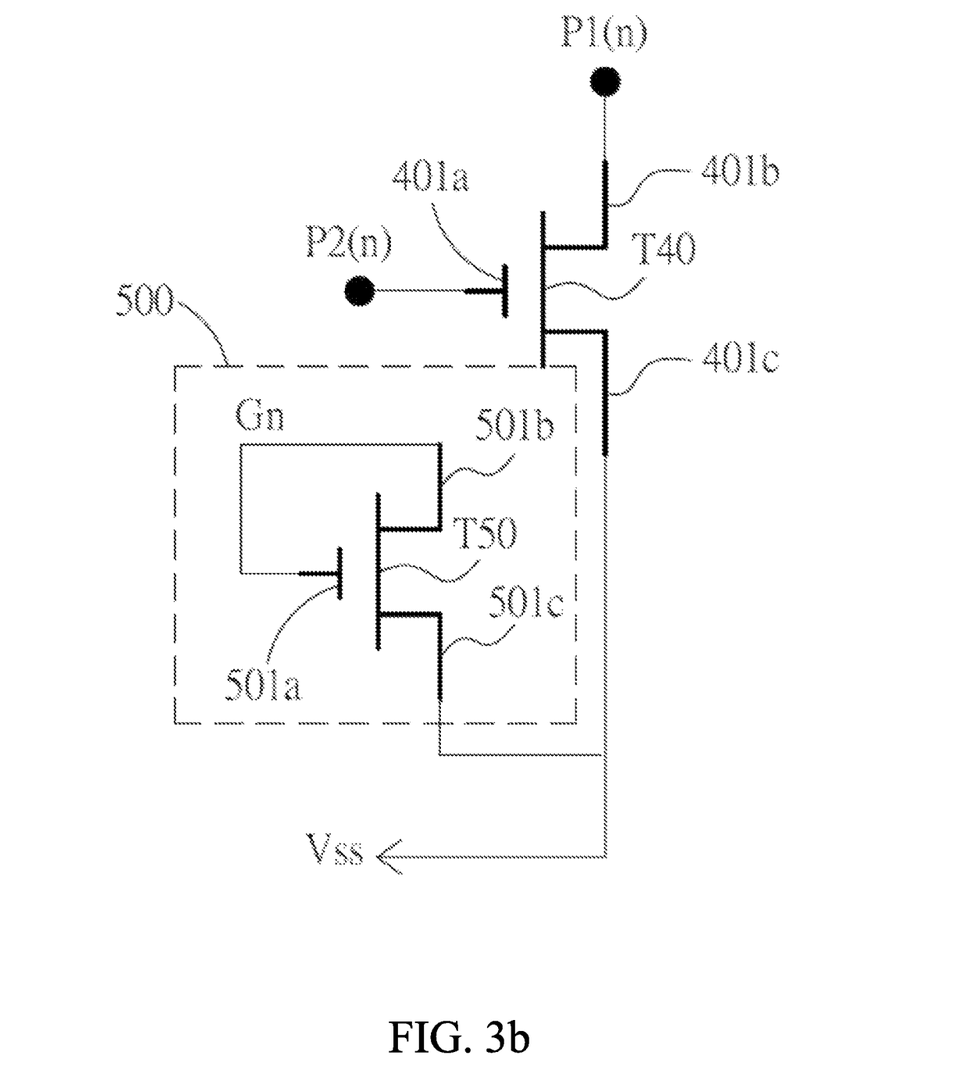
FIG. 3b is a schematic diagram of a compensation circuit in a shift register circuit according to an embodiment of this application.
Figure 4A:
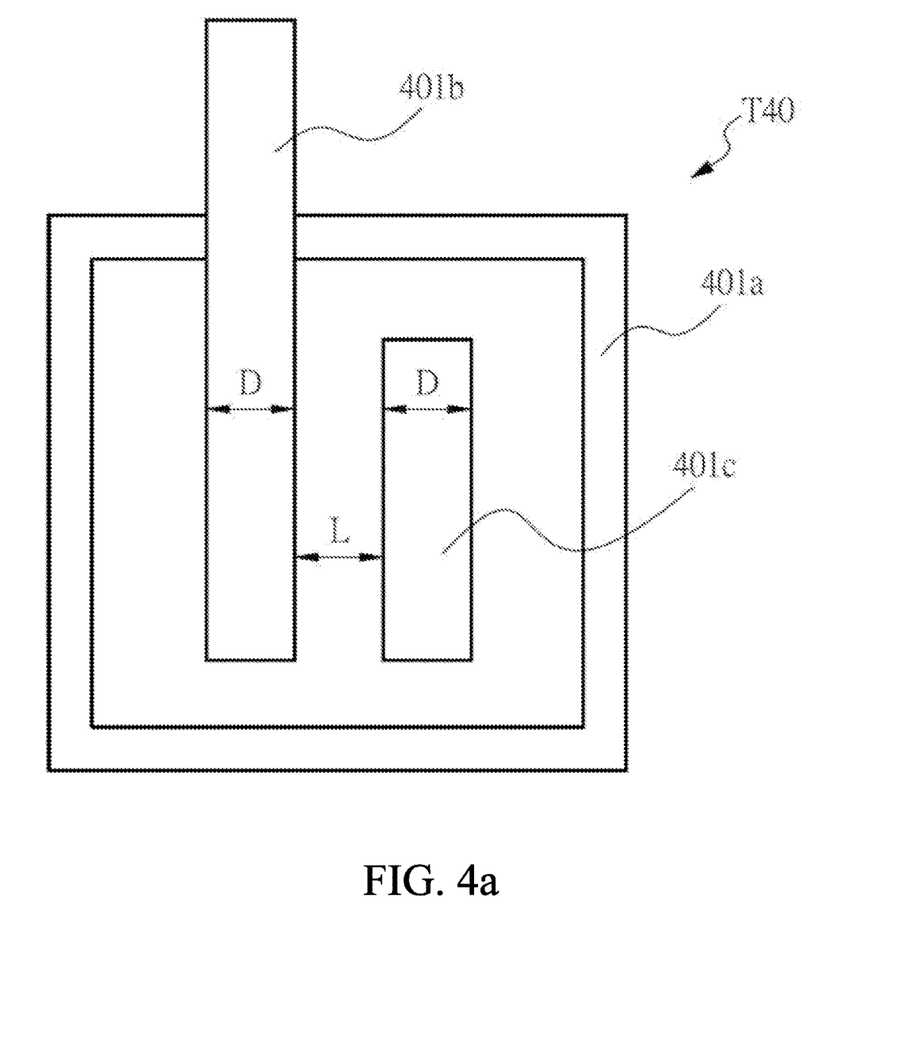
FIG. 4a is a schematic diagram of a length of an internal channel between a first end and a second end in an exemplary active switch.
Figure 4B:
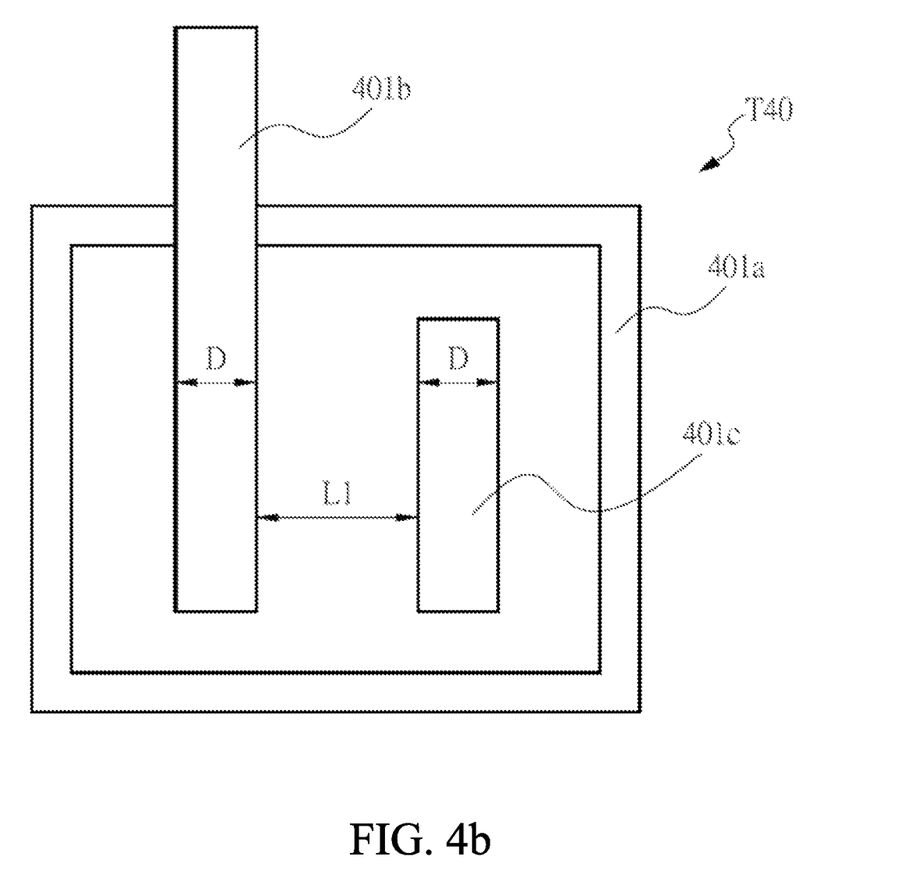
FIG. 4b is a schematic diagram of a length of an internal channel between a first end and a second end in an active switch according to an embodiment of this application.
Figure 4C:
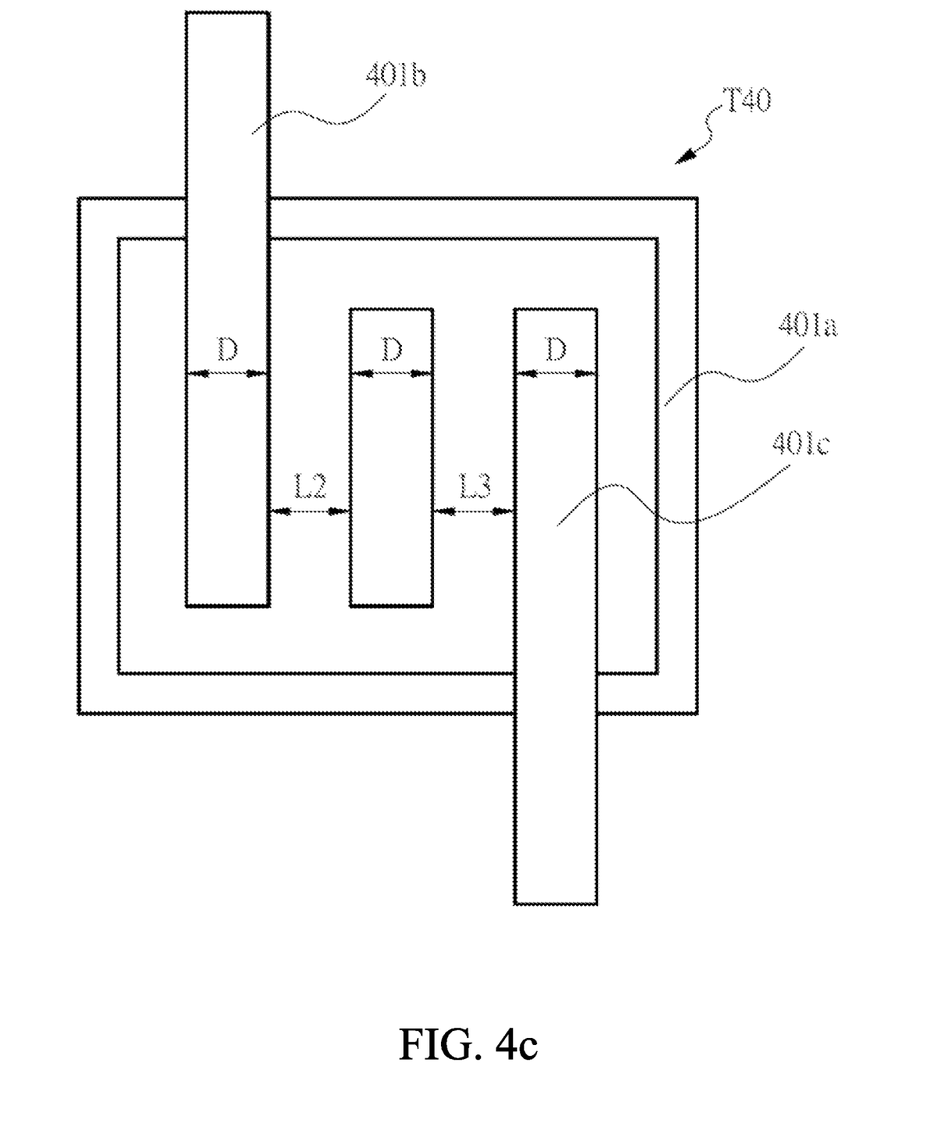
FIG. 4c is a schematic diagram of dual internal channels between a first end and a second end in an active switch according to another embodiment of this application.

FIG. 3a is a schematic diagram of a shift register circuit according to an embodiment of this application. FIG. 3b is a schematic diagram of a compensation circuit in a shift register circuit according to an embodiment of this application. FIG. 4a is a schematic diagram of a length of an internal channel between a first end and a second end in an exemplary active switch. FIG. 4b is a schematic diagram of a length of an internal channel between a first end and a second end in an active switch according to an embodiment of this application. FIG. 4c is a schematic diagram of dual internal channels between a first end and a second end in an active switch according to another embodiment of this application. Referring to FIG. 3a, FIG. 3b, FIG. 4a, FIG. 4b and FIG. 4c, in an embodiment of this application, a shift register circuit includes a plurality of stages of shift registers. Each shift register 300 includes: a first switch T10, including a control end 101a of the first switch T10 electrically coupled to a first node P1(n), a first end 101b of the first switch T10 electrically coupled to a frequency signal CK, and a second end 101c of the first switch T10 electrically coupled to an output pulse signal Gn; a second switch T20, including a control end 201a of the second switch T20 electrically coupled to an input pulse signal ST, a first end 201b of the second switch T20 electrically coupled to the input pulse signal ST, and a second end 201c of the second switch T20 electrically coupled to the first node P1(n); a third switch T30, including a control end 301a of the third switch T30 electrically coupled to a second node P2(n), a first end 301b of the third switch T30 electrically coupled to the output pulse signal Gn, and a second end 301c of the third switch T30 electrically coupled to a preset low potential Vss; and a fourth switch T40, including a control end 401a of the fourth switch T40 electrically coupled to the second node P2(n), a first end 401b of the fourth switch T40 electrically coupled to the first node P1(n), and a second end 401c of the fourth switch T40 electrically coupled to the preset low potential Vss, a length L of an internal channel between the first end 401b of the fourth switch T40 and an internal channel of the second end 401c of the fourth switch T40 is increased to L1, or an internal channel between the first end 401b of the fourth switch T40 and an internal channel of the second end 401c of the fourth switch T40 is designed as dual channels L2 and L3.

In an embodiment, a compensation circuit 500 is further included, and the compensation circuit 500 includes: a fifth switch T50, the fifth switch including a control end 501a of the fifth switch T50 electrically coupled to the output pulse signal Gn, a first end 510b of the fifth switch T50 electrically coupled to the output pulse signal Gn, and a second end 501c of the fifth switch T50 electrically coupled to the preset low potential Vss.

In an embodiment, a pull-down sub-circuit 220 is further included, and is electrically coupled to the first node P1(n), the output pulse signal Gn, and the preset low potential Vss of the shift register 300.

In an embodiment, a pull-down sub-circuit controller 210 is further included, and is electrically coupled to the preset low potential Vss and the pull-down sub-circuit 220 of the shift register 300.

In an embodiment, the compensation circuit 500 is configured to reduce a potential difference between the control end 401a of the fourth switch T40 and the first end 401b of the fourth switch T40, so as to prevent an electrical leakage.

Referring to FIG. 3a and FIG. 3b, in an embodiment of this application, a waveform generating method for a shift register circuit is applied to a plurality of stages of shift registers. The shift register 300 includes a first switch T10, a second switch T20, a third switch T30, a fourth switch T40, a compensation circuit 500, a pull-down sub-circuit 220, and a pull-down sub-circuit controller 210. The first switch T10 is configured to generate an output signal Gn of the shift register 300, and provide the output signal to a next-stage shift register. The waveform generating method includes: conducting the first switch T10, and pulling up a potential of an output end of the shift register 300 by using a frequency signal CK; reducing a potential difference between a control end 401a of the fourth switch T40 and a first end 401b of the fourth switch T40 by adding the compensation circuit 500; and pulling down the potential of the output end of the shift register 300 by means of an input pulse signal ST by using the second switch T20 and the pull-down sub-circuit 220.

In an embodiment, in the waveform generating method, the step of reducing a potential difference between a control end 401a of the fourth switch T40 and a first end 401b of the fourth switch T40 by adding the compensation circuit 500 includes: adding a fifth switch T50 to the shift register 300, a control end 501a of the fifth switch T50 is electrically coupled to an output pulse signal Gn, a first end 501b of the fifth switch T50 is electrically coupled to the output pulse signal Gn, and a second end 501c of the fifth switch T50 is electrically coupled to a preset low potential Vss.

In an embodiment, the waveform generating method further includes a pull-down sub-circuit 220, electrically coupled to the first node P1(n), the output pulse signal Gn and the preset low potential Vss of the shift register 300.

In an embodiment, in the waveform generating method, a pull-down sub-circuit controller 210 is further included, and is electrically coupled to the preset low potential Vss and the pull-down sub-circuit 220 of the shift register 300.

In an embodiment, in the waveform generating method, the compensation circuit 500 is configured to reduce a potential difference between the control end 401a of the fourth switch T40 and the first end 401b of the fourth switch T40, so as to prevent an electrical leakage.

Figure 5:
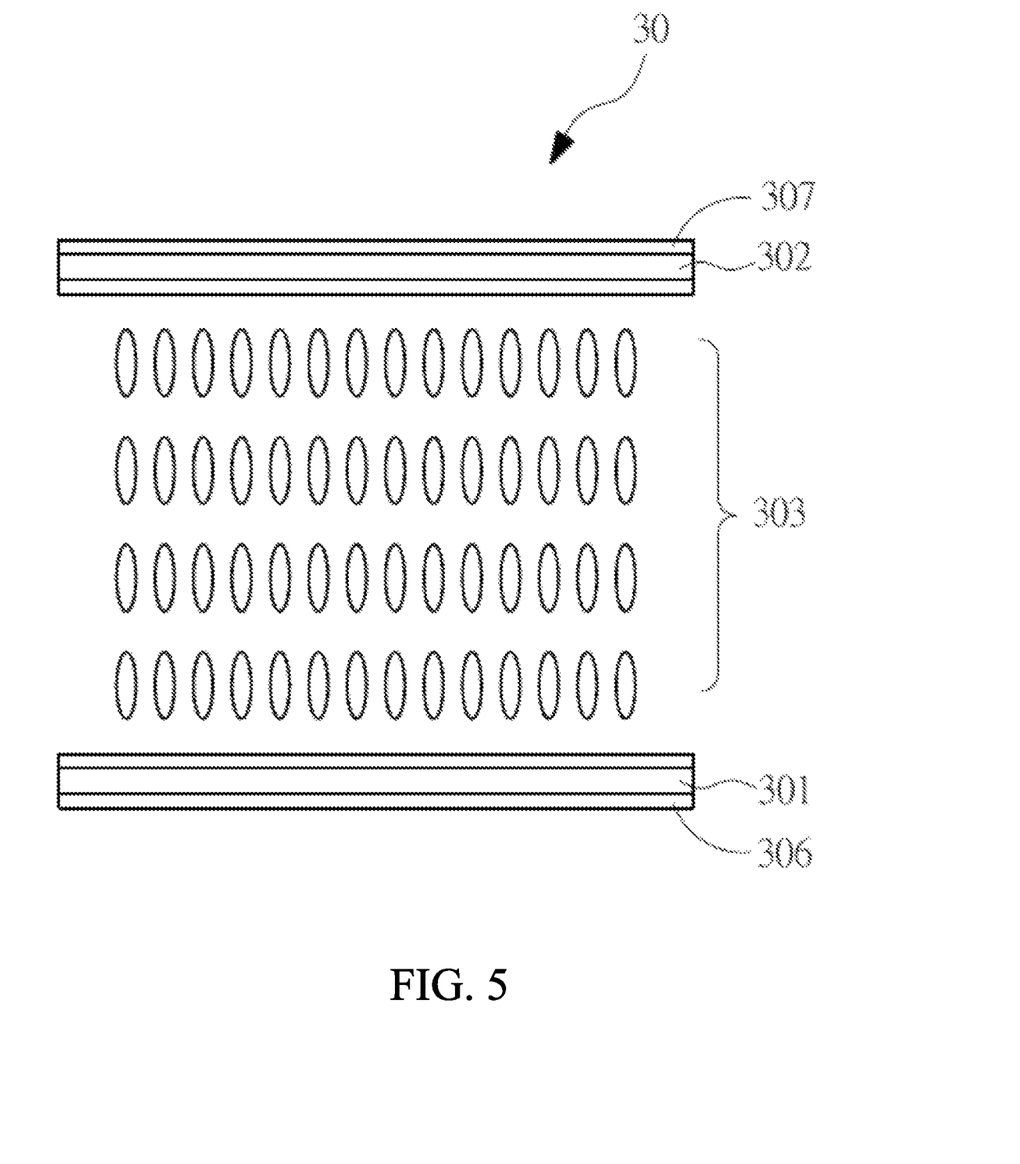
FIG. 5 is a schematic diagram of a liquid crystal display panel according to another embodiment of this application.

FIG. 5 is a schematic diagram of a liquid crystal display panel according to another embodiment of this application. Referring to FIG. 5 and FIG. 3a, in an embodiment of this application, a liquid crystal display panel 30 includes: a first substrate 301 (for example, an active array substrate); a second substrate 302 (for example, a color filter substrate), disposed opposite to the first substrate 301; a liquid crystal layer 303, disposed between the first substrate 301 and the second substrate 302; and further includes the shift register circuit 300, disposed between the first substrate 301 and the second substrate 302 (for example, on a surface of the first substrate 301). The liquid crystal display further includes a first polarizing plate 306, disposed on an outer surface of the first substrate 301; and a second polarizing plate 307, disposed on an outer surface of the second substrate 302, where a polarization direction of the first polarizing plate 306 and a polarization direction of the second polarizing plate 307 are parallel to each other.

In another embodiment, a display panel may be an OLED display panel, a QLED display panel, a plasma display panel, or another display panel. The display panel includes: a first substrate; and a plurality of pixels, formed on the first substrate; and further includes a shift register circuit 300, disposed on the first substrate.

This application resolves an electrical leakage problem of a GOA circuit substrate, and improves reliability and a service life of a product.

Terms, such as "in some embodiments" and "in various embodiments", are repeatedly used. The terms usually not refer to a same embodiment, but they may refer to a same embodiment. Words, such as "comprise", "have", and "include", are synonyms, unless other meanings are indicated in the context of the words.

The foregoing descriptions are merely preferred embodiments of this application, and are not intended to limit this application in any form. Although this application has been disclosed above through the preferred embodiments, the embodiments are not intended to limit this application. Any person skilled in the art can make some equivalent variations or modifications according to the foregoing disclosed technical content without departing from the scope of the technical solutions of this application to obtain equivalent embodiments. Any simple amendment, equivalent change or modification made to the foregoing embodiments according to the technical essence of this application without departing from the content of the technical solutions of this application shall fall within the scope of the technical solutions of this application.

What is claimed is:

1. A shift register circuit, comprising a plurality of stages of shift registers, wherein each shift register comprises:
   a first switch, including a control end of the first switch electrically coupled to a first node, a first end of the first switch electrically coupled to a frequency signal, and a second end of the first switch electrically coupled to an output pulse signal;
   a second switch, including a control end of the second switch electrically coupled to an input pulse signal, a first end of the second switch electrically coupled to the input pulse signal, and a second end of the second switch electrically coupled to the first node;
   a third switch, including a control end of the third switch electrically coupled to a second node, a first end of the third switch electrically coupled to the output pulse signal, and a second end of the third switch electrically coupled to a preset low potential;
   a fourth switch, including a control end of the fourth switch electrically coupled to the second node, a first end of the fourth switch electrically coupled to the first node, and a second end of the fourth switch electrically coupled to the preset low potential, wherein a length of an internal channel between the first end of the fourth switch and the second end of the fourth switch is increased, or an internal channel between the first end of the fourth switch and the second end of the fourth switch is designed as dual channels; and
   a compensation circuit, comprising a fifth switch, the fifth switch including a control end of the fifth switch electrically coupled to the output pulse signal, a first end of the fifth switch electrically coupled to the output pulse signal, and a second end of the fifth switch electrically coupled to the preset low potential.

2. The shift register circuit according to claim 1, wherein the compensation circuit is configured to reduce a potential difference between the control end of the fourth switch and the first end of the fourth switch.

3. The shift register circuit according to claim 1, further comprising a pull-down sub-circuit, electrically coupled to the first node, the output pulse signal, and the preset low potential of the shift register.

4. The shift register circuit according to claim 3, further comprising a pull-down sub-circuit controller electrically coupled to the preset low potential and the pull-down sub-circuit of the shift register.

5. A waveform generating method for a shift register circuit, applied to a plurality of stages of shift registers, wherein the shift register comprises a first switch, a second switch, a third switch, a fourth switch, a compensation circuit, a pull-down sub-circuit and a pull-down sub-circuit controller, wherein the first switch is configured to generate an output signal of the shift register and provide the output signal to a next-stage shift register, and the waveform generating method comprising:
   conducting the first switch, and pulling up a potential of an output end of the shift register by using a frequency signal;
   reducing a potential difference between a control end of the fourth switch and a first end of the fourth switch by adding the compensation circuit, comprising
      adding a fifth switch to the shift register, wherein a control end of the fifth switch is electrically coupled to an output pulse signal, a first end of the fifth switch is electrically coupled to the output pulse signal, and a second end of the fifth switch is electrically coupled to a preset low potential; and
   pulling down the potential of the output end of the shift register by means of an input pulse signal by using the second switch and the pull-down sub-circuit.

6. The waveform generating method for a shift register circuit according to claim 5, further comprising a pull-down sub-circuit, electrically coupled to a first node, the output pulse signal and the preset low potential of the shift register.

7. The waveform generating method for a shift register circuit according to claim 5, further comprising a pull-down sub-circuit controller, electrically coupled to the preset low potential and the pull-down sub-circuit of the shift register.

8. The waveform generating method for a shift register circuit according to claim 5, wherein the compensation circuit is configured to reduce the potential difference between the control end of the fourth switch and the first end of the fourth switch.

9. A display panel, comprising:
a first substrate;
a plurality of pixels, formed on the first substrate;
a shift register circuit, comprising a plurality of stages of shift registers, wherein each shift register comprises:
a first switch, including a control end of the first switch electrically coupled to a first node, a first end of the first switch electrically coupled to a frequency signal, and a second end of the first switch electrically coupled to an output pulse signal;
a second switch, including a control end of the second switch is electrically coupled to an input pulse signal, a first end of the second switch electrically coupled to the input pulse signal, and a second end of the second switch electrically coupled to the first node;
a third switch, including a control end of the third switch electrically coupled to a second node, a first end of the third switch electrically coupled to the output pulse signal, and a second end of the third switch electrically coupled to a preset low potential;
a fourth switch, including a control end of the fourth switch electrically coupled to the second node, a first end of the fourth switch electrically coupled to the first node, and a second end of the fourth switch electrically coupled to the preset low potential, wherein
a length of an internal channel between the first end of the fourth switch and the second end of the fourth switch is increased, or an internal channel between the first end of the fourth switch and the second end of the fourth switch is designed as dual channels; and
the shift register circuit is disposed on the first substrate; and
a compensation circuit, comprising a fifth switch, the fifth switch including a control end of the fifth switch electrically coupled to the output pulse signal, a first end of the fifth switch electrically coupled to the output pulse signal, and a second end of the fifth switch electrically coupled to the preset low potential.

10. The display panel according to claim 9, wherein the compensation circuit is configured to reduce a potential difference between the control end of the fourth switch and the first end of the fourth switch.

11. The display panel according to claim 9, further comprising a pull-down sub-circuit, electrically coupled to the first node, the output pulse signal, and the preset low potential of the shift register.

12. The display panel according to claim 11, further comprising a pull-down sub-circuit controller, electrically coupled to the preset low potential and the pull-down sub-circuit of the shift register.

* * * * *